United States Patent
Lim et al.

(10) Patent No.: US 11,798,967 B2
(45) Date of Patent: Oct. 24, 2023

(54) IMAGE SENSOR PACKAGE WITH TRANSPARENT ADHESIVE COVERING THE OPTICAL SENSING CIRCUIT

(71) Applicants: STMicroelectronics Asia Pacific Pte Ltd, Singapore (SG); STMicroelectronics (Grenoble 2) SAS, Grenoble (FR)

(72) Inventors: How Yang Lim, Simei (SG); Olivier Zanellato, Chambery (FR)

(73) Assignees: STMicroelectronics Asia Pacific Pte Ltd, Singapore (SG); STMicroelectronics (Grenoble 2) SAS, Grenoble (FR)

( * ) Notice: Subject to any disclaimer, the term of this patent is extended or adjusted under 35 U.S.C. 154(b) by 31 days.

(21) Appl. No.: 17/495,047

(22) Filed: Oct. 6, 2021

(65) Prior Publication Data
US 2023/0104584 A1    Apr. 6, 2023

(51) Int. Cl.
*H01L 27/146* (2006.01)
*H01L 23/31* (2006.01)
*H01L 23/00* (2006.01)
*H04N 23/55* (2023.01)

(52) U.S. Cl.
CPC ........ *H01L 27/14627* (2013.01); *H01L 23/31* (2013.01); *H01L 24/14* (2013.01); *H04N 23/55* (2023.01)

(58) Field of Classification Search
CPC .................................. H01L 27/14627

USPC ........................................... 257/432
See application file for complete search history.

(56) References Cited

U.S. PATENT DOCUMENTS

| 8,269,300 | B2 | 9/2012 | Chien et al. |
| 8,969,120 | B2 * | 3/2015 | Huang .............. H01L 31/0203 |
| | | | 257/784 |
| 10,998,361 | B2 | 5/2021 | Lin et al. |
| 11,056,529 | B2 * | 7/2021 | Yeh .................. H01L 27/14618 |
| 2020/0098806 | A1 * | 3/2020 | Lin .................... H01L 27/14634 |

OTHER PUBLICATIONS

ABLESTIK ATB 120U datasheet, Henkel, 2016 (2 pages).

* cited by examiner

*Primary Examiner* — Ajay Arora
(74) *Attorney, Agent, or Firm* — CROWE & DUNLEVY

(57) ABSTRACT

An integrated circuit package includes a support substrate having a front side and a back side and an optical integrated circuit die having a back side mounted to the front side of the support substrate and having a front side with an optical sensing circuit. A glass optical element die has a back side mounted to the front side of the optical integrated circuit die over the optical sensing circuit. The mounting of the glass optical element die is made by a layer of transparent adhesive which extends to the cover the optical sensing circuit and a portion of the front side of the optical integrated circuit die peripherally surrounding the optical sensing circuit. An encapsulation material body encapsulates the glass optical element die and the optical integrated circuit die.

11 Claims, 1 Drawing Sheet

IMAGE SENSOR PACKAGE WITH TRANSPARENT ADHESIVE COVERING THE OPTICAL SENSING CIRCUIT

TECHNICAL FIELD

Embodiments herein relate to the packaging of integrated circuits and, in particular, to the packaging of image sensor integrated circuits.

BACKGROUND

Image sensor integrated circuit packages typically include a supporting substrate to which an image sensor integrated circuit die is mounted. The die includes an optical sensing circuit. A transparent optical element is mounted over the optical sensing circuit. It is important that thermal cycling of the package, for example in the context of solder reflow operations, not cause damage to the package.

SUMMARY

In an embodiment, an integrated circuit package comprises: a support substrate having a front side and a back side; an optical integrated circuit die having a back side mounted to the front side of the support substrate and having a front side with an optical sensing circuit; a glass optical element die having a back side mounted to the front side of the optical integrated circuit die over the optical sensing circuit; wherein the mounting of the glass optical element die is made by a film layer of transparent adhesive which extends to the cover the optical sensing circuit and a portion of the front side of the optical integrated circuit die peripherally surrounding the optical sensing circuit; and an encapsulation material body which encapsulates the glass optical element die and the optical integrated circuit die.

The optical sensing circuit may include an array of microlenses provided over a corresponding array of photosensitive elements. The film layer of transparent adhesive is provided to extend over and in contact with the array of microlenses.

The film layer of transparent adhesive comprises a transparent die attach film have a suitable thickness to cover and encapsulate the array of microlenses.

BRIEF DESCRIPTION OF THE DRAWINGS

For a better understanding of the embodiments, reference will now be made by way of example only to the accompanying figures in which.

It will be noted that the drawings are not necessarily presented to scale, and some exaggeration of sizes, shapes, thicknesses, etc., has been made in order ease understanding of the illustrated structures.

DETAILED DESCRIPTION

Figure 1:
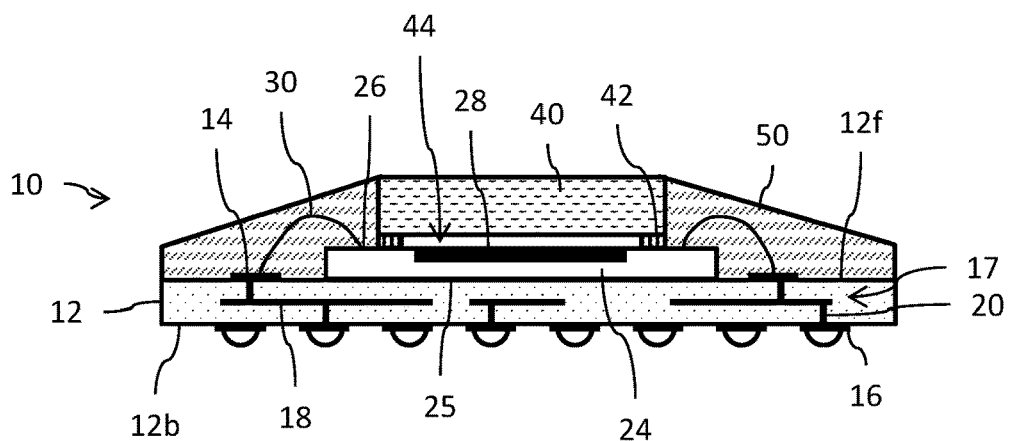
FIG. 1 shows a cross sectional view of an embodiment of an image sensor integrated circuit package.

FIG. 1 shows a cross sectional view of an embodiment of an image sensor integrated circuit package 10.

An insulating support substrate 12 includes a front side 12f and a backside 12b. First conductive pads 14 are located on the front side 12f and second conductive pads 16 are located on the back side 12b. Although not specifically illustrated, electrically conductive lines forming a redistribution network may be included on the front side 12f and/or the backside 12b and connected for signal and power routing to the pads 14 and 16, as needed. An electrical interconnection network 17 within the insulating support substrate 12 electrically connects the first conductive pads 14 to the second conductive pads 16. The insulating support substrate 12 may comprise a multi-layer structure, and in such a case the electrical interconnection network 17 includes a plurality of electrically conductive lines 18 and electrically conductive vias 20 located on and/or in the various layers of the multi-layer structure. In a single layer insulating support substrate 12, only the vias 20 are used to make electrical connections between the front side 12f and backside 12b of the insulating support substrate 12. Although not specifically illustrated, the front side 12f and backside 12b of the insulating support substrate 12 may be coated with a protective insulating layer (such as a passivation or solder mask layer) with an opening provided at the locations of each pad 14, 16.

The back side of an image sensor integrated circuit die 24 is mounted to the front side 12f of the insulating support substrate 12 using a thin layer of adhesive material 25 (for example, using a suitable die attach adhesive film). The front side of the image sensor integrated circuit die 24 includes a plurality of die pads 26 and an optical sensing circuit 28. Bonding wires 30 electrically connect the die pads 26 of the image sensor integrated circuit die 24 to the first conductive pads 14 of the insulating support substrate 12. The optical sensing circuit 28 may, for example, be formed by an array of photosensitive elements (for example, photodiodes).

To protect the optical sensing circuit 28, an optical element 40 is mounted to the front side of the image sensor integrated circuit die 24 by a ring 42 of adhesive material. The adhesive material used for the ring 42 is typically a glass attach glue such as a UV-light cured epoxy. The optical element 40 may, for example, comprise a transparent glass die having one or more surfaces coated with an anti-reflective material. This mounting scheme leaves a hermetically sealed cavity 44, laterally delimited by the ring 42 of adhesive material, between a bottom of the optical element 40 and the front side of the image sensor integrated circuit die 24 over the optical element 40.

An encapsulation material is then dispensed around the optical element to form a package body 50 encapsulating the optical element 40, the image sensor integrated circuit die 24 and the bonding wires 30. Use made be made, for example, of suitable dam and fill process with a needle dispensing the encapsulation material constrained by a surrounding dam of resin and with a volume sufficient to cover the bonding wires and reach the peripheral top edge of the optical element.

A solder ball 56 is mounted to each of the second conductive pads 16.

The heat applied during various reflow operations for the solder balls 56 (for example, during formation of the solder balls on the pads 16 and during mounting of the image sensor integrated circuit package 10 to an integrated circuit board) can cause an expansion of the fluid (for example air or other gas) located within the hermetically sealed cavity 44. This expansion applies an outward force which, if sufficient in magnitude, results in a delamination of the optical element 40 from the image sensor integrated circuit die 24, a cracking of the optical element 40 itself, and/or a breaking of the hermetic seal.

Figure 2:
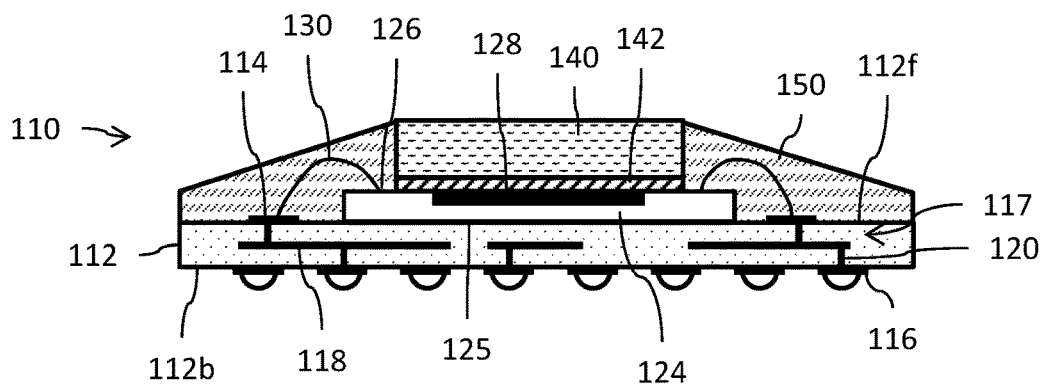
FIG. 2 shows a cross sectional view of another embodiment for an image sensor integrated circuit package.

FIG. 2 shows a cross sectional view of another embodiment for an image sensor integrated circuit package 110 that addresses the foregoing issue.

An insulating support substrate 112 includes a front side 112f and a backside 112b. First conductive pads 114 are located on the front side 112f and second conductive pads 116 are located on the back side 112b. Although not specifically illustrated, electrically conductive lines forming a redistribution network may be included on the front side 112f and/or the backside 112b and connected for signal and power routing to the pads 114 and 116, as needed. An electrical interconnection network 117 within the insulating support substrate 112 electrically connects the first conductive pads 114 to the second conductive pads 116. The insulating support substrate 112 may comprise a multi-layer structure, and in such a case the electrical interconnection network 117 includes a plurality of electrically conductive lines 118 and electrically conductive vias 120 located on and/or in the various layers of the multi-layer structure. In a single layer insulating support substrate 121, only the vias 120 are used to make electrical connections between the front side 112f and backside 112b of the insulating support substrate 112. Although not specifically illustrated, the front side 112f and backside 112b of the insulating support substrate 112 may be coated with a protective insulating layer (such as a passivation or solder mask layer) with an opening provided at the locations of each pad 114, 116.

The back side of an image senor integrated circuit die 124 is mounted to the front side 112f of the insulating support substrate 112 using a thin layer of adhesive material 124 (for example, using a suitable die attach adhesive film). The front side of the image sensor integrated circuit die 124 includes a plurality of die pads 126 and an optical sensing circuit 128. Bonding wires 130 electronically connect the die pads 126 of the image sensor integrated circuit die 124 to the first conductive pads 114 of the insulating support substrate 112. The optical sensing circuit 128 may, for example, be formed by an array of photosensitive elements (for example, photodiodes). The optical sensing circuit 128 may include a layer including a plurality of microlenses 129 extending over the array of photosensitive elements (see, detailed cross section of FIG. 3).

Figure 3:
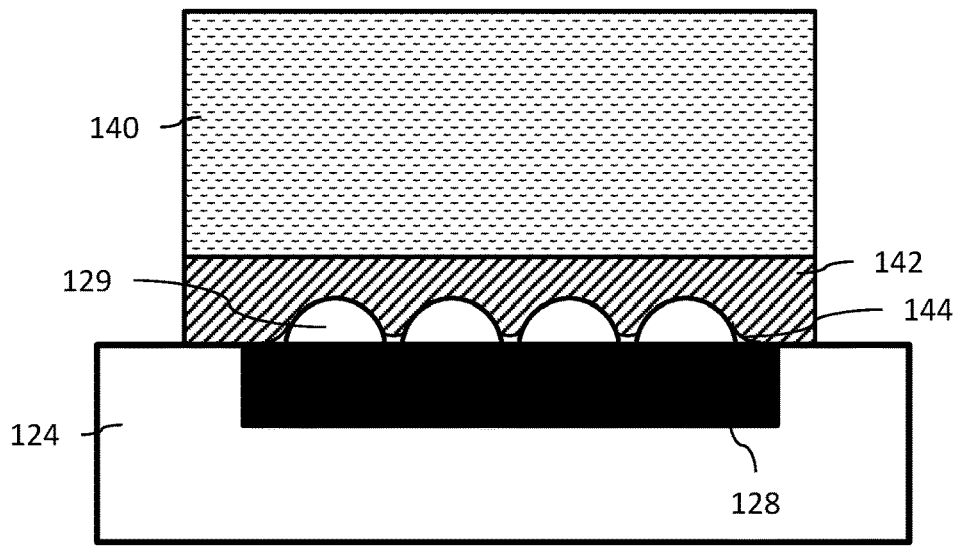
FIG. 3 shows a detailed cross sectional view of a portion of FIG. 2.

To protect the optical sensing circuit 128, an optical element 140 is mounted to the front side of the image sensor integrated circuit die 124 by a layer 142 of adhesive material. The adhesive material used for the layer 142 is a transparent die attach film (for example, Locktite® Ablestik ATB 120U from Henkel) with a thickness in a range of 15-25 μm, and more specifically with a thickness of 20 μm. The film is applied to the front side of the image sensor integrated circuit die 124 prior to placement and attachment of the optical element 140. The use of a film adhesive, rather than a deposited flowable and subsequently cured adhesive, is preferred as the film will present a consistent thickness with no sloppy squeeze out or mess during the assembly process. The optical element 140 may, for example, comprise a transparent glass die having one or more surfaces coated with an anti-reflective material. The film layer 142 extends to pass over the optical element 140 and a portion of the front side of the image sensor integrated circuit die 124 peripherally surrounding the optical element 140. The film layer 142 attaches to the plurality of microlenses 129 of the optical sensing circuit 128 (see, FIG. 3). In a preferred implementation, the layer substantially encapsulates the plurality of microlenses 129 (here, substantially encapsulates means contacts nearly all (if not all) of the convex surface of the microlenses and covers nearly all (if not all) of the portion of upper surface of the image sensor integrated circuit die 124 peripherally surrounding the optical sensing circuit 128). The goal with the coverage of the film layer 142 is to minimize the size of, if not eliminate entirely, any hermetically sealed cavity or cavities 144 located underneath the optical element 140 (such cavities 144 perhaps being trapped at corners where the microlens meets the upper surface of the image sensor integrated circuit die 124, as shown in FIG. 3, by example). It will be noted that the total volume of the cavities 144, if present, is significantly smaller than the volume of the cavity 44.

An encapsulation material is then dispensed around the optical element to form a package body 150 encapsulating the optical element 140, the image sensor integrated circuit die 124 and the bonding wires 130. Use made be made, for example, of suitable dam and fill process with a needle dispensing the encapsulation material constrained by a surrounding dam of resin and with a volume sufficient to cover the bonding wires and reach the peripheral top edge of the optical element. The package body 150 is in contact with the layer 142 of adhesive material portion of the front side of the image sensor integrated circuit die 124 peripherally surrounding the optical element 140 to form a seal.

A solder ball 156 is mounted to each of the second conductive pads 116.

An advantage of the construction for the image sensor integrated circuit package 110 is that the use of the film layer 142 to mount the optical element 140 to the front side of the image sensor integrated circuit die 124 minimizes the size of, or eliminates the presence of, any air cavity 144 (compare to reference 44, FIG. 1) between the optical element 140 and the image sensor integrated circuit die 124. There is accordingly no concern with a delamination occurrence due to expansion forces resulting from the application of heat during various reflow operations for the solder balls 56.

The foregoing description has provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit package, comprising:
   a support substrate having a front side and a back side;
   an optical integrated circuit die having a back side mounted to the front side of the support substrate and having a front side with an optical sensing circuit;
   a glass optical element die having a back side mounted to the front side of the optical integrated circuit die over the optical sensing circuit;
   a film layer of transparent adhesive positioned between the glass optical element and the optical integrated circuit die, wherein said film layer extends to cover the optical sensing circuit and a portion of the front side of the optical integrated circuit die peripherally surrounding the optical sensing circuit; and
   an encapsulation material body which encapsulates the glass optical element die and the optical integrated circuit die.

2. The integrated circuit package of claim 1, wherein said film layer of transparent adhesive comprises a die attach film layer.

3. The integrated circuit package of claim 1, further comprising a plurality of solder balls attached to corresponding pads at the back side of the support substrate.

4. The integrated circuit package of claim 1, further comprising a plurality of bonding wires electrically connecting the optical integrated circuit die to corresponding pads at the front side of the support substrate.

5. The integrated circuit package of claim 4, wherein said encapsulation material body further encapsulates the bonding wires.

6. The integrated circuit package of claim 1, wherein said encapsulation material body is in contact with the film layer of transparent adhesive at said portion of the front side of the optical integrated circuit die peripherally surrounding the optical sensing circuit.

7. The integrated circuit package of claim 1, wherein the optical sensing circuit comprises an array of microlenses, and wherein said film layer of transparent adhesive is in contact with the array of microlenses.

8. The integrated circuit package of claim 7, wherein said film layer of transparent adhesive substantially encapsulates the array of microlenses.

9. A method for making an integrated circuit package, comprising:

providing a support substrate having a front side and a back side;

mounting a back side of an optical integrated circuit die mounted to the front side of the support substrate, wherein a front side of the optical integrated circuit die includes an optical sensing circuit;

applying a film layer of transparent adhesive to cover the optical sensing circuit and a portion of the front side of the optical integrated circuit die peripherally surrounding the optical sensing circuit;

mounting a back side of a glass optical element die to the film layer of transparent adhesive front side of the optical integrated circuit die over the optical sensing circuit; and encapsulating the glass optical element die and the optical integrated circuit die in an encapsulation material body.

10. The integrated circuit package of claim 9, wherein applying the film layer comprises applying a transparent die attach film layer.

11. The integrated circuit package of claim 10, wherein the optical sensing circuit comprises an array of microlenses, and wherein applying the transparent die attach film layer comprises applying said transparent die attach film layer in contact with the array of microlenses.

* * * * *